(12) United States Patent
Liu

(10) Patent No.: US 9,036,345 B2
(45) Date of Patent: May 19, 2015

(54) ELECTRONIC DEVICE AND LOCKING MECHANISM THEREOF

(71) Applicant: WISTRON CORP., New Taipei (TW)

(72) Inventor: Li-Wei Liu, New Taipei (TW)

(73) Assignee: Wistron Corp., New Taipei (TW)

( * ) Notice: Subject to any disclaimer, the term of this patent is extended or adjusted under 35 U.S.C. 154(b) by 212 days.

(21) Appl. No.: 13/935,341

(22) Filed: Jul. 3, 2013

(65) Prior Publication Data

US 2014/0009051 A1 Jan. 9, 2014

(30) Foreign Application Priority Data

Jul. 4, 2012 (TW) .............................. 101212887 U

(51) Int. Cl.
*G06F 1/16* (2006.01)
*H05K 5/02* (2006.01)
*H05K 5/00* (2006.01)

(52) U.S. Cl.
CPC ............ *H05K 5/0221* (2013.01); *H05K 5/0017* (2013.01); *G06F 1/1616* (2013.01); *G06F 1/1679* (2013.01)

(58) Field of Classification Search
USPC ................. 16/382, 223, 319, 334; 361/679.3, 361/679.01, 679.58, 679.56, 679.08, 361/679.26, 679.27, 679.33, 679.45, 361/679.29, 679.55, 679.04, 679.09, 361/679.07, 679.47; 312/326, 228, 334.24, 312/334.25, 208.1, 405.1, 405, 223.1; 292/129, 337, 145, 137; 248/187.1, 248/228.3, 227.1, 914, 495, 476, 231.41, 248/496, 231.91; 439/310, 567, 352, 350, 439/345; 345/173, 169, 156, 174, 172, 1.3, 345/104, 4, 102, 184
See application file for complete search history.

(56) References Cited

U.S. PATENT DOCUMENTS

2007/0014083 A1* 1/2007 Tanaka et al. .................. 361/683
2014/0077675 A1* 3/2014 Liang et al. .................... 312/326
2014/0233167 A1* 8/2014 Rayner ....................... 361/679.3

* cited by examiner

*Primary Examiner* — Hung Duong

(57) ABSTRACT

A locking mechanism, adapted for connecting a first member to a second member, is provided. The locking mechanism includes a wedging unit, a locking unit and a pushing element. The wedging unit is disposed on the first member, and includes a hook movable between a wedging position and a separation position. The locking unit is disposed on the second member, and includes a locking element disposed in the second member, wherein the locking element is movable between a locking position and a releasing position. When the pushing element is moved toward a first direction, the pushing element pushes the locking element from the locking position to the releasing position to release the hook, and when the pushing element is moved toward a second direction, the pushing element pushes the hook from the wedging position to the separation position to release the hook.

19 Claims, 9 Drawing Sheets

US 9,036,345 B2

ELECTRONIC DEVICE AND LOCKING MECHANISM THEREOF

CROSS REFERENCE TO RELATED APPLICATIONS

This Application claims priority of Taiwan Patent Application No. 101212887, filed on Jul. 4, 2012, the entirety of which is incorporated by reference herein.

BACKGROUND OF THE INVENTION

1. Field of the Invention

The present invention relates to a locking mechanism, and in particular relates to a locking mechanism utilized in portable electronic devices.

2. Description of the Related Art

Conventional portable electronic devices, for example, notebook computers, comprise a body and a cover. The cover pivots on the body. A locking mechanism is disposed between the cover and the body. When the cover covers the body, the locking mechanism connects the cover to the body. Conventionally, the locking mechanism comprises a pushing element. When the pushing element is moved toward an unlocking direction, the connection of the locking mechanism between the cover and the body is removed, and the cover can be pivoted relative to the body.

However, in conventional portable electronic devices, the connection of the locking mechanism between the cover and the body can be removed only by moving the pushing element in one single direction, and it is inconvenient to operate.

BRIEF SUMMARY OF THE INVENTION

A locking mechanism, adapted for connecting a first member to a second member, is provided. The locking mechanism includes a wedging unit, a locking unit and a pushing element. The wedging unit is disposed on the first member, and includes a hook movable between a wedging position and a separation position. The locking unit is disposed on the second member, and includes a locking element disposed in the second member, wherein the locking element is movable between a locking position and a releasing position, wherein under a locking state, the hook wedges the locking element, and the hook is in the wedging position, and the locking element is in the locking position. When the pushing element is moved toward a first direction, the pushing element pushes the locking element from the locking position to the releasing position to release the hook, and when the pushing element is moved toward a second direction, the pushing element pushes the hook from the wedging position to the separation position to release the hook.

In an embodiment of the invention, the first direction is opposite to the second direction. Utilizing the electronic device and the locking mechanism of an embodiment of the invention, the user pushes the pushing element toward the first direction or the second direction to unlock the locking mechanism, and the unlocking procedure is simplified. Additionally, in an embodiment of the invention, the utilization of a Hall effect sensor switch can be reduced, and the cost of the electronic device can be decreased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description carrying out the invention. This description is made for the purpose of illustrating the general principles of the invention and should not be taken in a limiting sense. The scope of the invention is best determined by reference to the appended claims.

Figure 1:
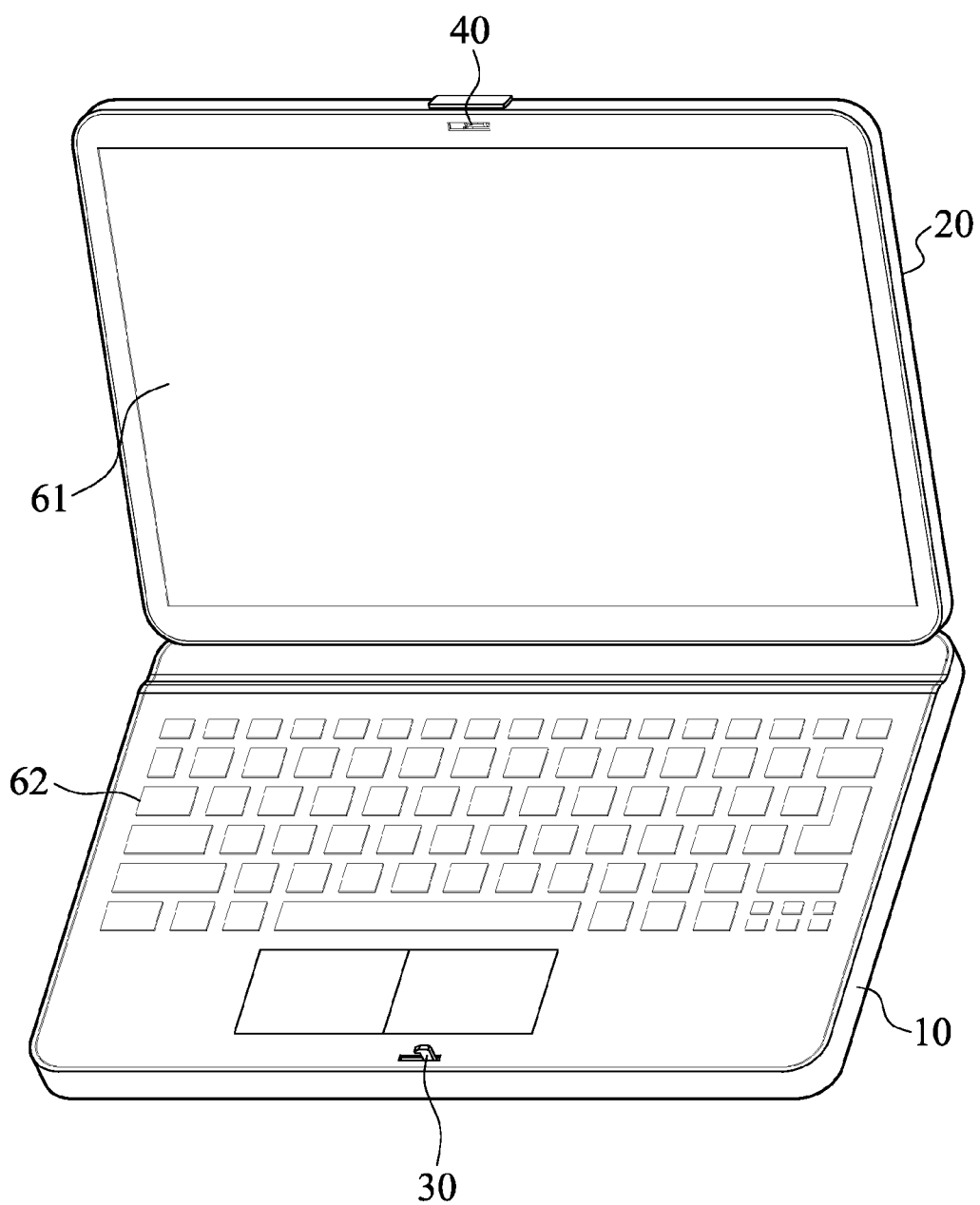
FIG. 1 shows an electronic device of an embodiment of the invention.

FIG. 1 shows an electronic device 1 of an embodiment of the invention, comprising a first member 10, a second member 20 and a locking mechanism. The locking mechanism is utilized to lock the first member 10 with the second member 20. The second member 20 pivots on the first member 10 via a pivot mechanism (not shown). The locking mechanism comprises a wedging unit 30 and a locking unit 40. The wedging unit 30 is disposed on the first member 10. The locking unit 40 is disposed on the second member 20.

Figure 2A:
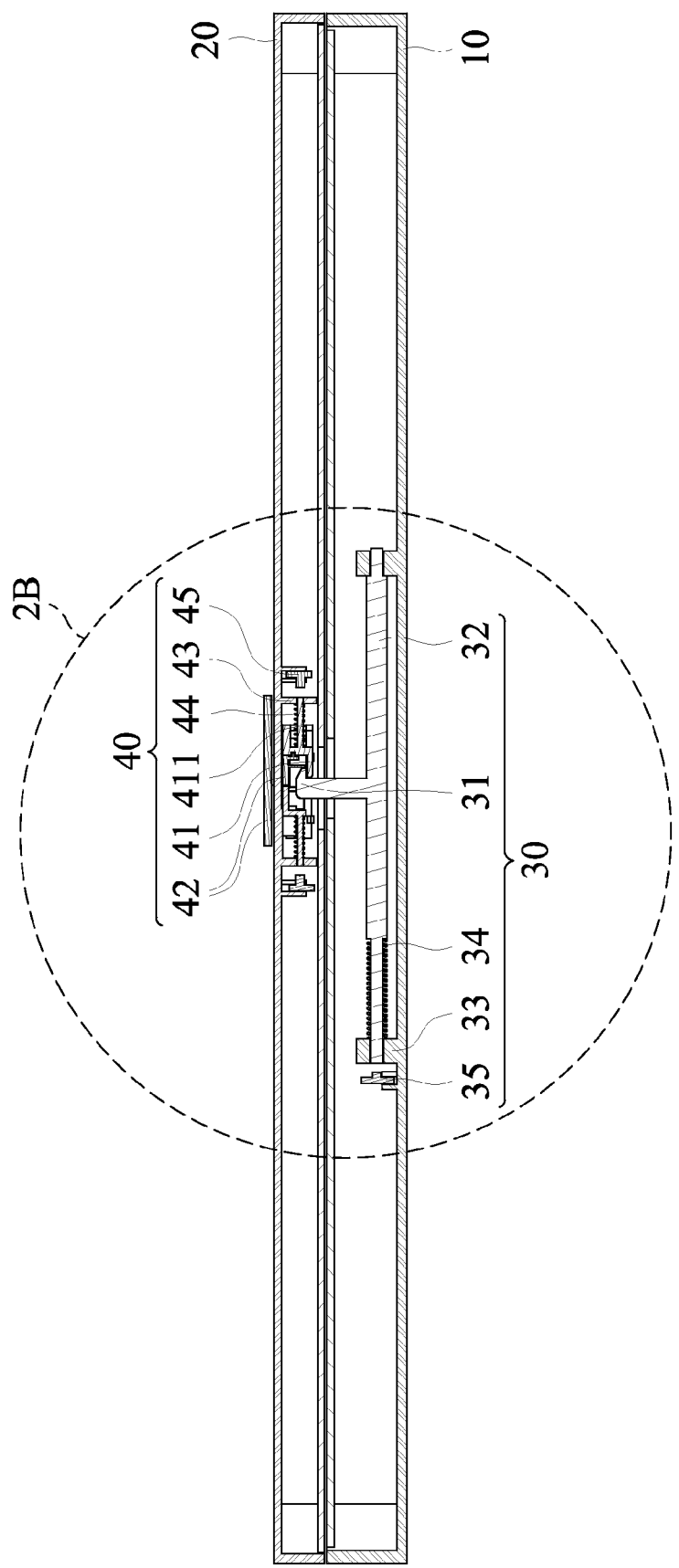
FIG. 2A shows the locking mechanism of the embodiment of the invention in a locking state.
Figure 2B:
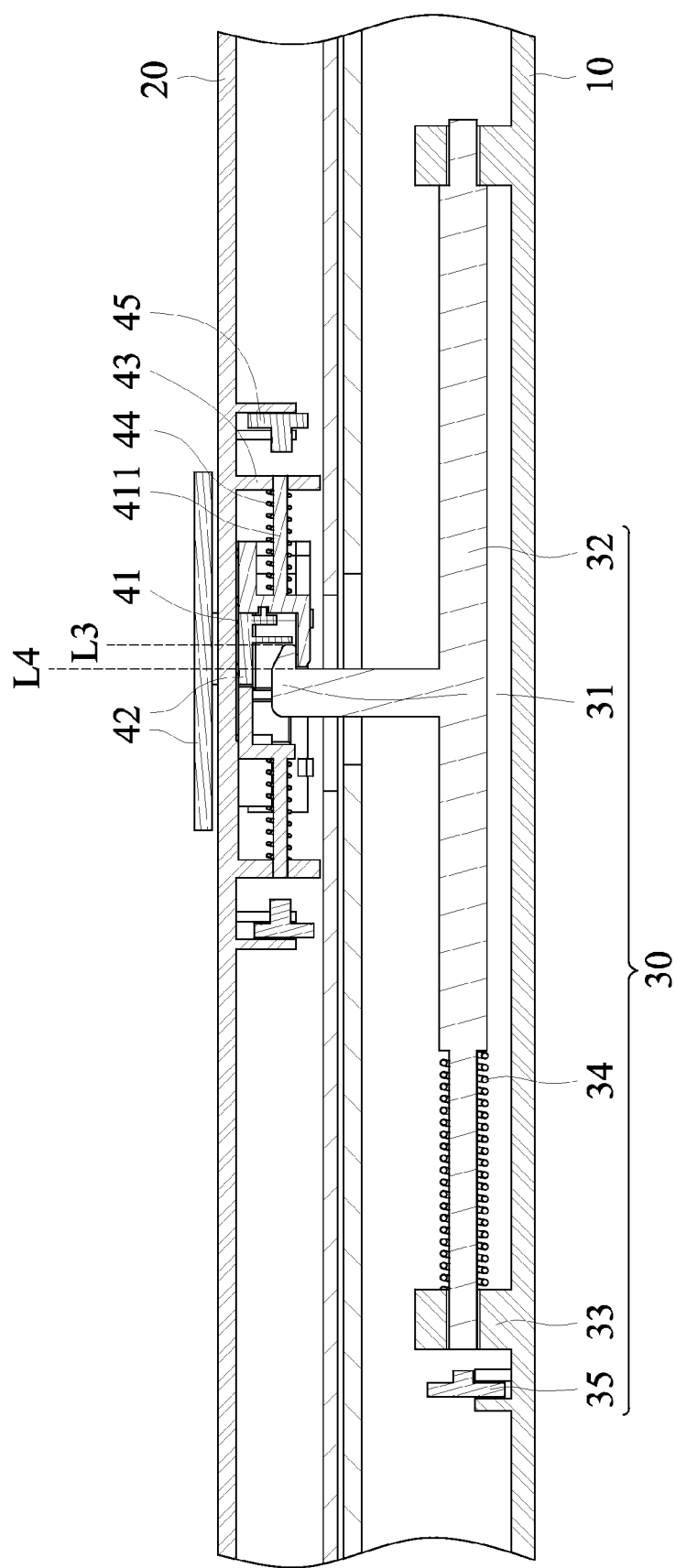
FIG. 2B is an enlarged view of portion 2B of FIG. 2A.
Figure 4A:
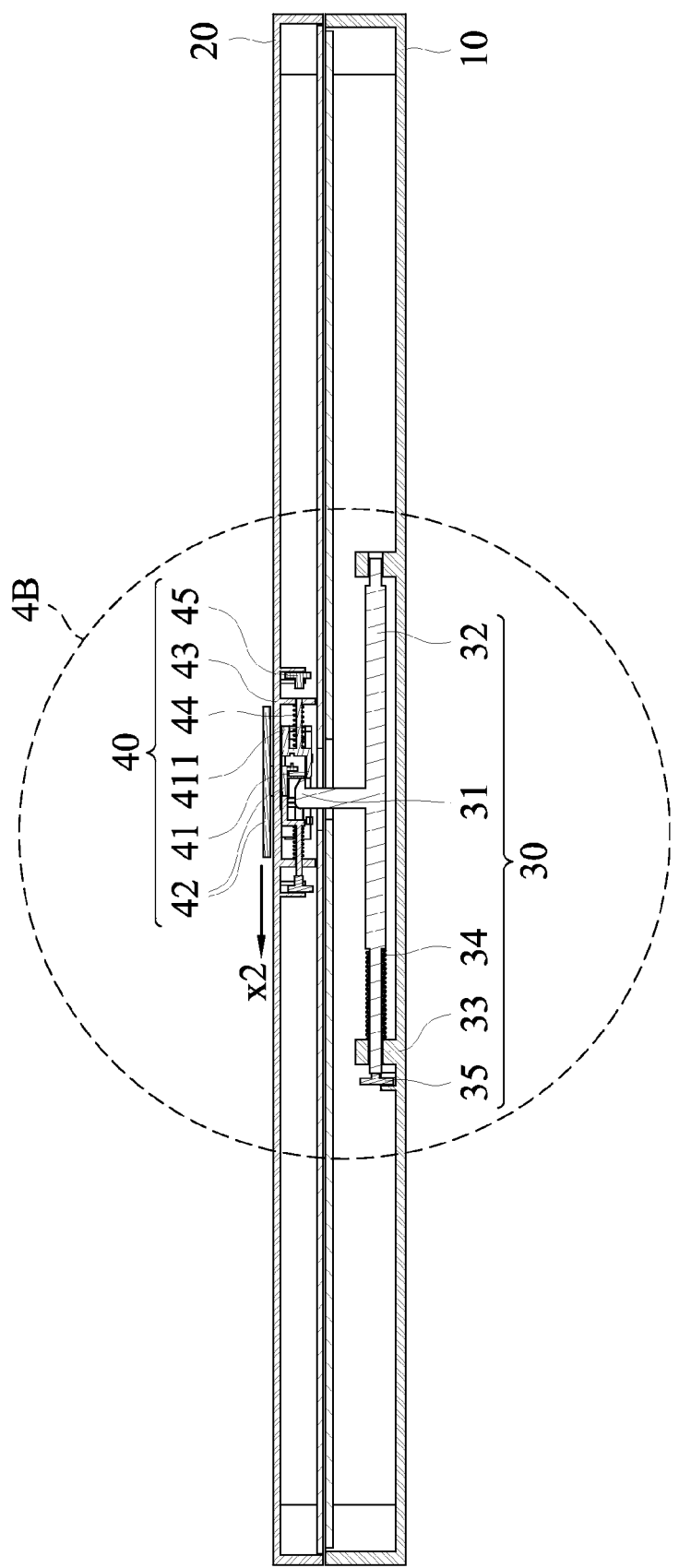
FIG. 4A shows the pushing element of the embodiment of the invention which is moved toward the second direction to release the hook.
Figure 4B:
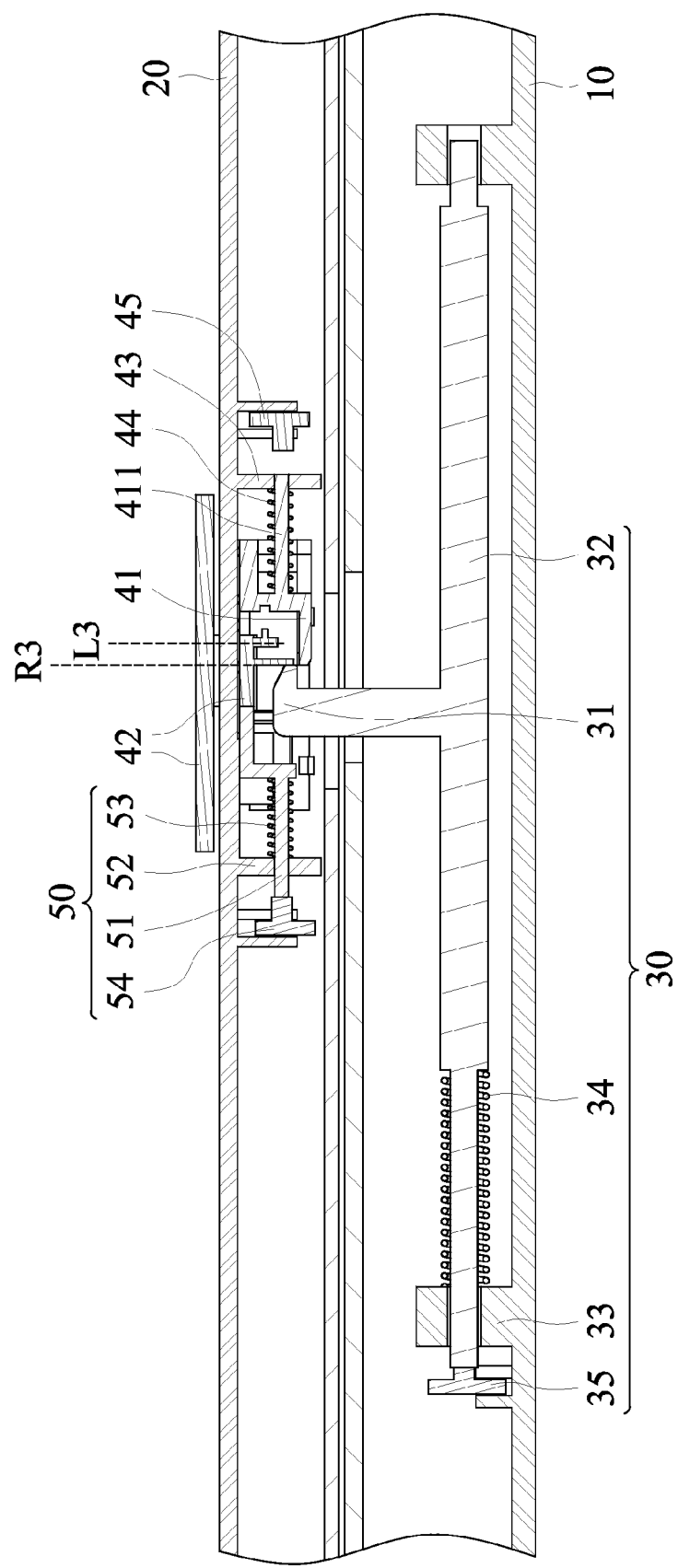
FIG. 4B is an enlarged view of portion 4B of FIG. 4A.

With reference to FIGS. 2A and 2B, FIG. 2A shows the locking mechanism in a locking state, and FIG. 2B is an enlarged view of portion 2B of FIG. 2A. The wedging unit 30 comprises a hook 31, a moveable rod 32, a first restriction portion 33 and an elastic element 34. The hook 31 is movable between a wedging position L3 (FIGS. 2A and 2B) and a separation position R3 (FIGS. 4A and 4B). The moveable rod 32 is disposed in the first member 10, wherein the hook 31 is connected to the moveable rod 32, and the moveable rod 32 moves along with the hook 31. The moveable rod 32 is restricted by the first restriction portion 33 and make the hook 31 to moved between the wedging position and the separation position, and the first elastic element 34 is disposed on the moveable rod 32, and the first elastic element 34 abuts the first restriction portion 33 and the moveable rod 32 to provide a recovery force to the moveable rod 32.

Figure 3A:
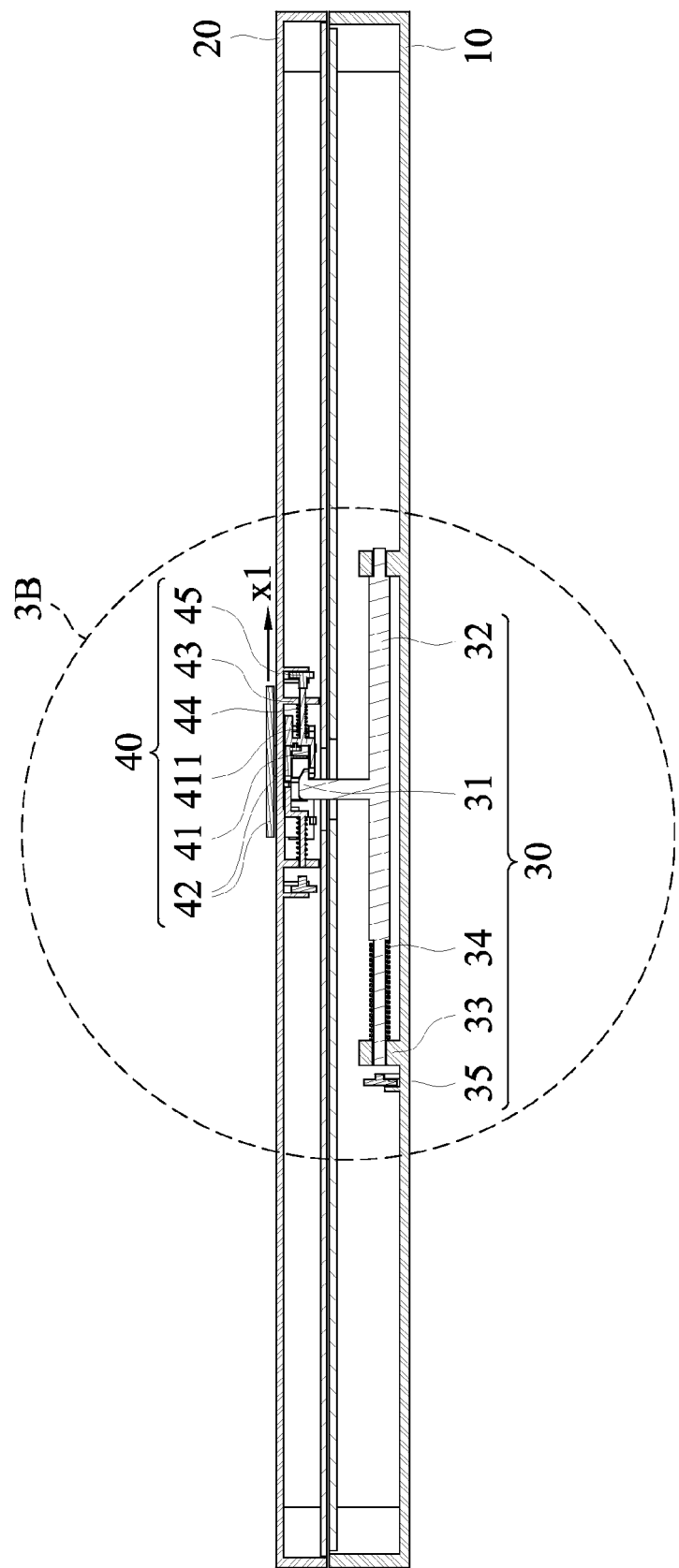
FIG. 3A shows the pushing element of the embodiment of the invention which is moved toward the first direction to release the hook.
Figure 3B:
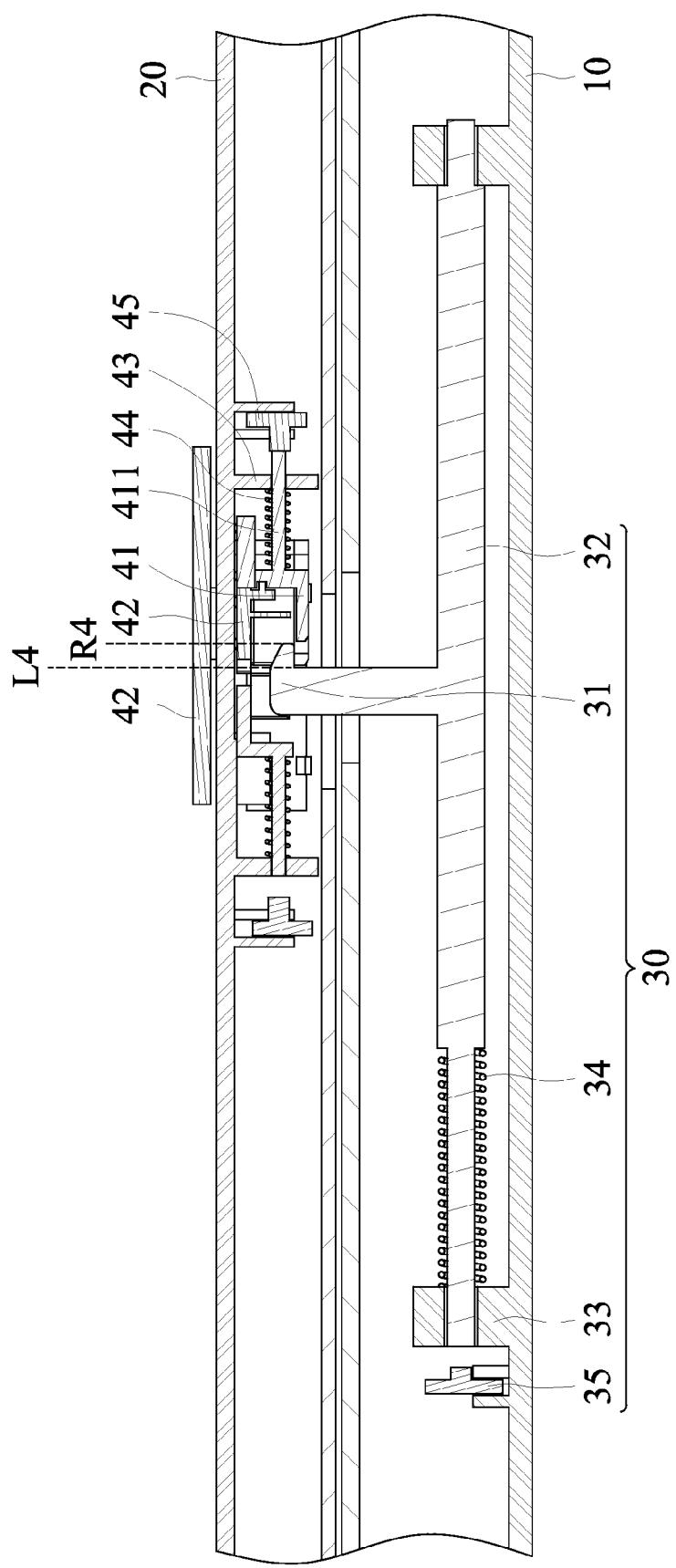
FIG. 3B is an enlarged view of portion 3B of FIG. 3A.

With reference to FIGS. 2A and 2B, the locking unit 40 comprises a locking element 41 and a pushing element 42. The locking element 41 is disposed in the second member 20. The locking element 41 is moved between a locking position L4 (FIGS. 2A and 2B) and a releasing position R4 (FIGS. 3A and 3B). Under a locking state (FIGS. 2A and 2B), the hook 31 wedges the locking element 41, the hook 31 is in the wedging position and the locking element 41 is in the locking position.

With reference to FIGS. 3A and 3B, when the pushing element 42 is moved toward a first direction x1, the pushing element 42 pushes the locking element 41 from the locking position L4 to the releasing position R4 to release the hook 31.

With reference to FIGS. 4A and 4B, when the pushing element 42 is moved toward a second direction x2, the pushing element 42 pushes the hook 31 from the wedging position L3 to the separation position R3 to release the hook 31.

In the embodiment above, the first direction x1 is opposite to the second direction x2. Utilizing the electronic device and the locking mechanism of the embodiment of the present invention, the user pushes the pushing element 42 toward the first direction x1 or the second direction x2 to unlock the locking mechanism, and the unlocking procedure is simplified.

Figure 5A:
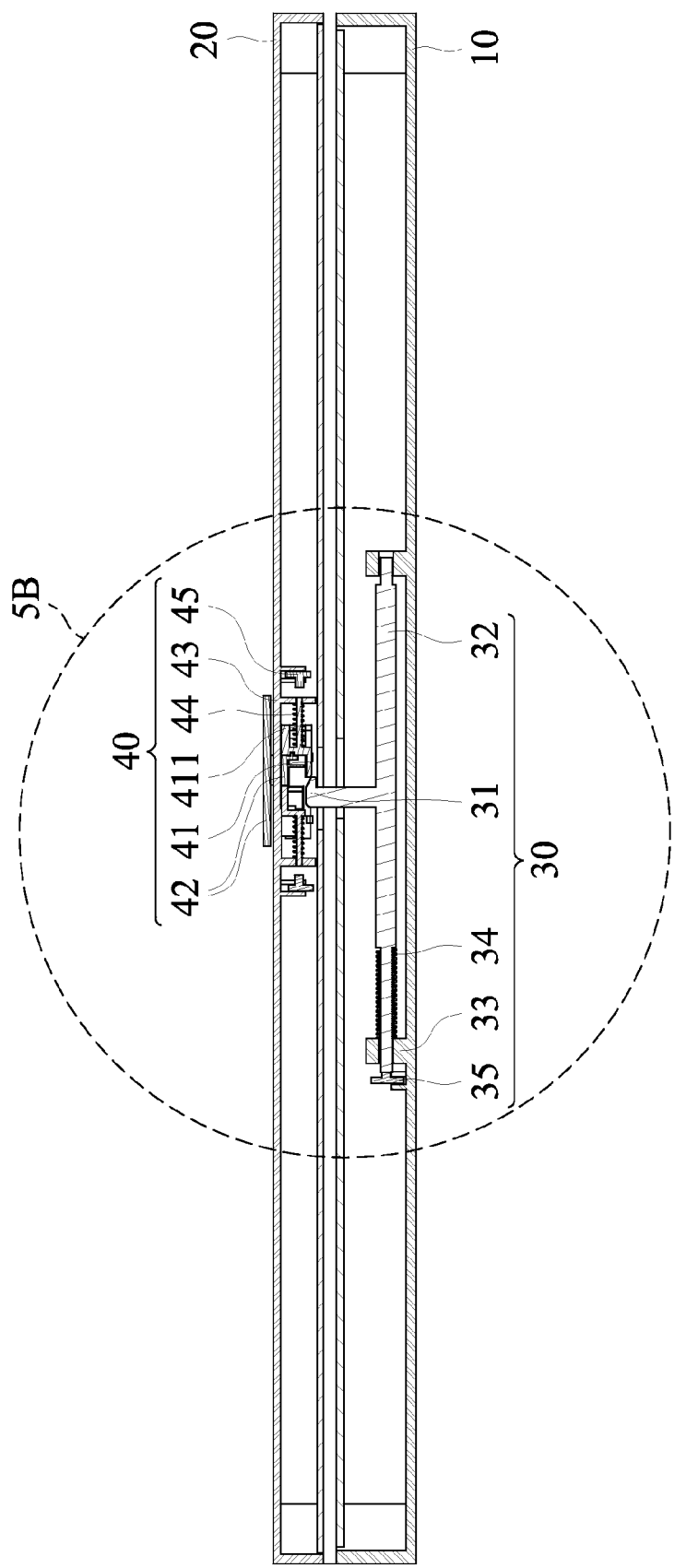
FIG. 5A shows the moveable rod of the embodiment of the invention which activated a first sensor to send a first signal.
Figure 5B:
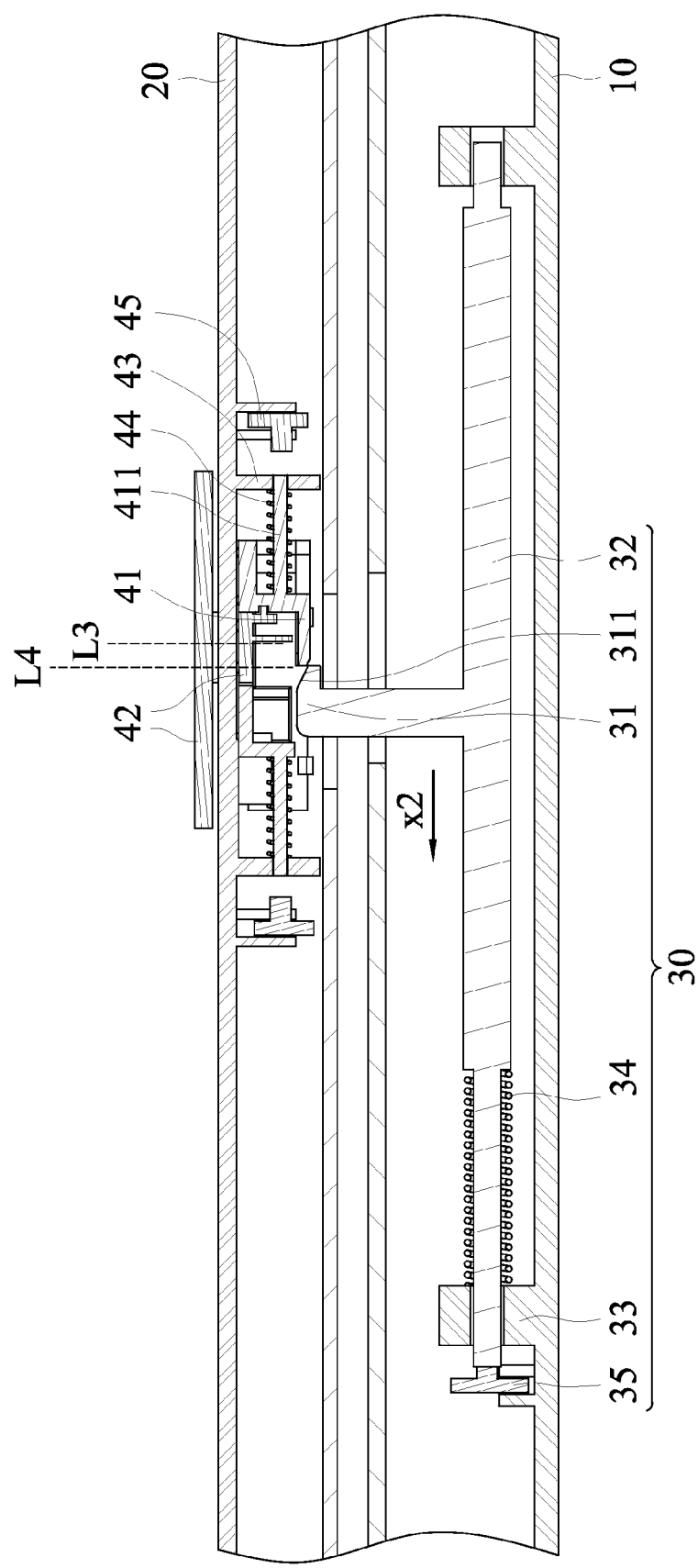
FIG. 5B is an enlarged view of portion 5B of FIG. 5A.

With reference to FIGS. 5A and 5B, the wedging unit 30 further comprises a first sensor 35. When the second member 20 covers the first member 10, the locking element 41 pushes an inclined plane 311 of the hook 31, and pushes the hook 31 toward the second direction x2. In this locking procedure, the hook 31 passes a sleeping position (FIGS. 5A and 5B), and the moveable rod 32 activates the first sensor 35 to send a first signal. The electronic device is switched to a sleeping mode or shut down according to the first signal.

With reference to FIGS. 3A and 3B, the locking element 41 comprises a locking arm 411, the locking unit 40 further comprises a second restriction portion 43 and a second elastic element 44, and the locking arm 411 is restricted by the second restriction portion 43, and therefore the locking element 41 is restricted to be moved between the locking position L4 and the releasing position R4. The second elastic element 44 is disposed on the locking arm 411, and the second elastic element 44 abuts the locking element 41 and the second restriction portion 43.

With reference to FIGS. 3A and 3B, the locking unit 40 further comprises a second sensor 45. When the locking element 41 is in the releasing position R4, the locking arm 411 activates the second sensor 45 to send a second signal. The electronic device is awakened or turned on according to the second signal.

With reference to FIGS. 4A and 4B, the locking mechanism further comprises a sensing unit 50. When the pushing element 42 is moved toward the second direction x2, the pushing element 42 pushes the hook 31 from the wedging position L3 toward the separation position R3, and the pushing element 42 activates the sensing unit 50 to send a third signal. The electronic device is awakened or turned on according to the third signal. The sensing unit 50 comprises a sensing rod 51, a third restriction portion 52, a third elastic element 53 and a third sensor 54, and the sensing rod 51 is restricted by the third restriction portion 52 and moves relative to the third restriction portion 52. The third elastic element 53 is disposed on the sensing rod 51, and the third elastic element 53 abuts the sensing rod 51 and the third restriction portion 52. When the hook 31 is pushed to the separation position R3, the sensing rod 51 is moved by the pushing element 42 to activate the third sensor 54 to send the third signal.

In an embodiment of the invention, the first sensor, the second sensor and the third sensor can be a limit switch or other switch elements. According to the present invention, the utilization of the Hall effect sensor switch can be reduced, and the cost of the electronic device can be decreased.

In an embodiment of the invention, the relationship of the sleeping position and the separation position can be modified with mechanical design. For example, modifying the inclined plane 311 of the hook 31, or modifying the wedging degree between the hook 31 and the locking element 41 can change the relationship of the sleeping position and the separation position. The drawings disclosed do not limit the invention.

With reference to FIG. 1, in the embodiment of the invention, the first member 10 is an electronic device body, the second member 20 is a cover, the first member 10 comprises an operation interface 62, and the second member 20 comprises a screen 61. In a modified example, the first member is a cover, the second member is an electronic device body, the first member comprises a screen, and the second member comprises an operation interface. The disclosed embodiments do not limit the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A locking mechanism, adapted for connecting a first member to a second member, comprising:
   a wedging unit, disposed on the first member, comprising:
      a hook, wherein the hook is movable between a wedging position and a separation position; and
   a locking unit, disposed on the second member, comprising:
      a locking element, disposed in the second member, wherein the locking element is movable between a locking position and a releasing position, wherein under a locking state, the hook wedges the locking element, and the hook is in the wedging position, and the locking element is in the locking position; and
      a pushing element, wherein when the pushing element is moved toward a first direction, the pushing element pushes the locking element from the locking position to the releasing position to release the hook, and when the pushing element is moved toward a second direction, the pushing element pushes the hook from the wedging position to the separation position to release the hook.

2. The locking mechanism as claimed in claim 1, wherein the wedging unit comprises a moveable rod, disposed in the first member, wherein the hook is connected to the moveable rod, and the moveable rod is moved with the hook.

3. The locking mechanism as claimed in claim 2, wherein the wedging unit further comprises a first restriction portion and a first elastic element, and the moveable rod is restricted by the first restriction portion to be moved between the wedging position and the separation position, and the first elastic element is disposed on the moveable rod, and the first elastic element abuts the first restriction portion and the moveable rod.

4. The locking mechanism as claimed in claim 3, wherein the wedging unit further comprises a first sensor, and when the hook is in a sleeping position, the moveable rod activates the first sensor to send a first signal.

5. The locking mechanism as claimed in claim 1, wherein the locking element comprises a locking arm, and the locking unit further comprises a second restriction portion and a second elastic element, and the locking arm is restricted by the second restriction portion and therefore the locking element is restricted to be moved between the locking position and the releasing position, and the second elastic element is disposed on the locking arm, and the second elastic element abuts the locking element and the second restriction portion.

6. The locking mechanism as claimed in claim 5, wherein the locking unit further comprises a second sensor, and when the locking element is in the releasing position, the locking arm activates the second sensor to send a second signal.

7. The locking mechanism as claimed in claim 1, further comprising a sensing unit, wherein when the pushing element is moved toward the second direction, the pushing element pushes the hook from the wedging position toward the separation position, and the pushing element activates the sensing unit to send a third signal.

8. The locking mechanism as claimed in claim 7, wherein the sensing unit comprises a sensing rod, a third restriction portion, a third elastic element and a third sensor, and the sensing rod is restricted by the third restriction portion and moves relative to the third restriction portion, and the third elastic element is disposed on the sensing rod, and the third elastic element abuts the sensing rod and the third restriction portion, and when the hook is pushed to the separation position, the sensing rod activates the third sensor to send the third signal.

9. An electronic device, comprising:
a first member;
a second member, connected to the first member;
a wedging unit, disposed on the first member, comprising:
   a hook, wherein the hook is movable between a wedging position and a separation position; and
a locking unit, disposed on the second member, comprising:
   a locking element, disposed in the second member, wherein the locking element is movable between a locking position and a releasing position, and under a locking state, the hook wedges the locking element, and the hook is in the wedging position, and the locking element is in the locking position; and
   a pushing element, wherein when the pushing element is moved toward a first direction, the pushing element pushes the locking element from the locking position to the releasing position to release the hook, and when the pushing element is moved toward a second direction, the pushing element pushes the hook from the wedging position to the separation position to release the hook.

10. The electronic device as claimed in claim 9, wherein the wedging unit comprises a moveable rod, disposed in the first member, wherein the hook is connected to the moveable rod, and the moveable rod is moved with the hook.

11. The electronic device as claimed in claim 10, wherein the wedging unit further comprises a first restriction portion and a first elastic element, and the moveable rod is restricted by the first restriction portion to be moved between the wedging position and the separation position, and the first elastic element is disposed on the moveable rod, and the first elastic element abuts the first restriction portion and the moveable rod.

12. The electronic device as claimed in claim 11, wherein the wedging unit further comprises a first sensor, and when the hook is in a sleeping position, the moveable rod activates the first sensor to send a first signal.

13. The electronic device as claimed in claim 9, wherein the locking element comprises a locking arm, and the locking unit further comprises a second restriction portion and a second elastic element, and the locking arm is restricted by the second restriction portion and therefore the locking element is restricted to be moved between the locking position and the releasing position, and the second elastic element is disposed on the locking arm, and the second elastic element abuts the locking element and the second restriction portion.

14. The electronic device as claimed in claim 13, wherein the locking unit further comprises a second sensor, and when the locking element is in the releasing position, the locking arm activates the second sensor to send a second signal.

15. The electronic device as claimed in claim 9, wherein the wedging unit further comprises a sensing unit, wherein when the pushing element is moved toward the second direction, the pushing element pushes the hook from the wedging position toward the separation position, and the pushing element activates the sensing unit to send a third signal.

16. The electronic device as claimed in claim 15, wherein the sensing unit comprises a sensing rod, a third restriction portion, a third elastic element and a third sensor, and the sensing rod is restricted by the third restriction portion and moves relative to the third restriction portion, and the third elastic element is disposed on the sensing rod, and the third elastic element abuts the sensing rod and the third restriction portion, and when the hook is pushed to the separation position, the sensing rod activates the third sensor to send the third signal.

17. The electronic device as claimed in claim 9, wherein the first member pivots on the second member.

18. The electronic device as claimed in claim 9, wherein the first member is an electronic device body, the second member is a cover, the first member comprises an operation interface, and the second member comprises a screen.

19. The electronic device as claimed in claim 9, wherein the first member is a cover, the second member is an electronic device body, the first member comprises a screen, and the second member comprises an operation interface.

* * * * *